United States Patent
Powell (10) Patent No.: US 7,247,584 B2
(45) Date of Patent: Jul. 24, 2007

(54) SYSTEM AND METHOD FOR SELECTIVELY INCREASING SURFACE TEMPERATURE OF AN OBJECT

(75) Inventor: Don Carl Powell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/931,592

(22) Filed: Aug. 31, 2004

(65) Prior Publication Data

US 2005/0028930 A1 Feb. 10, 2005

Related U.S. Application Data

(62) Division of application No. 10/238,141, filed on Sep. 10, 2002, which is a division of application No. 09/139,934, filed on Aug. 26, 1998, now Pat. No. 6,451,714.

(51) Int. Cl.
*H01L 21/26* (2006.01)
(52) U.S. Cl. .................. 438/795; 438/428
(58) Field of Classification Search ............. 432/24, 432/26, 37, 47, 48, 202; 438/795, 428, 778, 438/781
See application file for complete search history.

(56) References Cited

U.S. PATENT DOCUMENTS

| | | | |
|---|---|---|---|
| 1,827,530 A | 10/1931 | Le Grand | |
| 3,084,736 A | 4/1963 | Mentel et al. | |
| 3,675,905 A * | 7/1972 | Placek | 432/24 |
| 3,798,061 A | 3/1974 | Yamazaki | 117/213 |
| 3,982,878 A * | 9/1976 | Yamane et al. | 431/2 |
| 4,581,248 A | 4/1986 | Roche | 427/554 |
| 4,595,601 A | 6/1986 | Horioka et al. | 438/695 |
| 4,624,259 A | 11/1986 | Welt | 128/396 |
| 4,871,416 A * | 10/1989 | Fukuda | 438/708 |
| 5,228,206 A | 7/1993 | Grant et al. | 34/1 |
| 5,350,236 A | 9/1994 | Thakur et al. | |
| 5,409,858 A * | 4/1995 | Thakur et al. | 438/760 |
| 5,470,799 A * | 11/1995 | Itoh et al. | 438/708 |
| 5,508,881 A | 4/1996 | Stevens | 361/305 |
| 5,561,612 A | 10/1996 | Thakur | 364/557 |
| 5,633,211 A | 5/1997 | Imai et al. | 438/760 |
| 5,646,075 A | 7/1997 | Thakur et al. | 437/247 |
| 5,654,904 A * | 8/1997 | Thakur | 702/137 |
| 5,814,156 A * | 9/1998 | Elliott et al. | 134/1 |
| 5,865,906 A * | 2/1999 | Ferguson et al. | 136/253 |
| 5,935,528 A | 8/1999 | Stephenson et al. | |
| 6,015,759 A * | 1/2000 | Khan et al. | 438/707 |
| 6,069,400 A | 5/2000 | Kimura et al. | |
| 6,165,273 A * | 12/2000 | Fayfield et al. | 118/722 |
| 6,555,790 B1 * | 4/2003 | Ono et al. | 219/390 |

FOREIGN PATENT DOCUMENTS

JP 08-213389 8/1996

OTHER PUBLICATIONS

CRC Handbook of Chemistry and Physics, 63rd ed., CRC Press, Boca Raton, Florida, 1982, pp. E-201, E-383, E-384.*

(Continued)

*Primary Examiner*—Tuan H. Nguyen
(74) *Attorney, Agent, or Firm*—Schwegman, Lundberg, Woessner & Kluth, P.A.

(57) ABSTRACT

A system and method for selectively increasing the thermal effect of a radiant energy source to the surface of an object relative to the substrate is described in the context of rapid thermal processing of semiconductor wafers, and apparatus produced therefrom. A radiation-absorptive atmosphere is introduced between the radiant energy source and the object to increase conductive heat transfer to the surface of the object and reduce the available radiant heat transfer to the substrate, thereby increasing the thermal effect to the surface relative to the substrate.

26 Claims, 4 Drawing Sheets

OTHER PUBLICATIONS

"Simulation Tools for Design Optimization, and Control of Single Wafer RTP and CVD Systems", http://idefix.mit.edu/simulation_tools.html, (May 19, 1998),1-2.

Wolf, S., et al., *Silcon Processing for the VLSI ERA, vol. 1: Process Technology*, Lattice Press, Sunset Beach California, (1990),56-59; 189-191.

Zender, C. S., "A Global Climatology of the Concentration and Shortwave Absoprtion of the Collision Pairs O2 -O2 and O2-N2 and the dimer (H2O)2", http://www.arm.gov/docs/documents/technical/conf8/P00115, (Jun. 16, 1998),1.

Harrison, P., "Cassell Dictionary of Physics", 19.

* cited by examiner

SYSTEM AND METHOD FOR SELECTIVELY INCREASING SURFACE TEMPERATURE OF AN OBJECT

This application is a Divisional of U.S. application Ser. No. 10/238,141, filed Sep. 10, 2002, which is a Divisional of U.S. application Ser. No. 09/139,934, filed Aug. 26, 1998, now U.S. Pat. No. 6,451,714, both of which are incorporated herein by reference.

FIELD OF THE INVENTION

The present invention relates to selectively increasing surface layer temperature during radiant heating, and more specifically to the use of thermal radiation-absorptive gasses to selectively increase the surface temperature of a semiconductor wafer in relation to the substrate during Rapid Thermal Processing.

BACKGROUND OF THE INVENTION

Integrated circuits are often fabricated with one or more devices, which may include diodes, capacitors, and different varieties of transistors. These devices often have microscopic features that can only be manufactured with critical processing steps that require careful alignment of equipment used to build the devices. These microscopic features contain critical dimensions that will often define the performance of the device and its surrounding circuitry.

Additionally, the functionality of these devices is defined by creating precisely controlled regions of dopants within the various layers of a semiconductor wafer. These dopants, however, are susceptible to diffusion at elevated temperatures.

Semiconductor fabrication continues to advance, requiring finer dimensional tolerances and control. Modern integrated circuit design has advanced to the point where line width may be 0.25 microns or less, with junction depths on the order of 1500–2000 Angstroms. Thus, thermal effect to a semiconductor wafer must be reduced to limit the lateral diffusion of the dopants, and the associated broadening of line dimension. Thermal effect to a semiconductor wafer must also be limited to reduce forward diffusion of the dopants so junction depth does not shift.

An additional potential adverse effect of thermal treatment is chemical change of the materials utilized in the fabrication of a semiconductor wafer. As an example, refractory metal-silicide films may be formed during the fabrication of very large scale integration (VLSI) circuits as a gate or interconnect film. These refractory metal-silicides can be reduced to their elemental constituents under elevated thermal conditions, thus destroying the functionality of the device.

In an effort to reduce the magnitude of thermal requirements, and thus lessen the likelihood of adverse effects, differing processes have been developed. One such process is Rapid Thermal Processing (RTP). RTP is a short-duration, high-temperature, radiant-heating process. RTP may be found in a multitude of semiconductor fabrication processes in a variety of forms, including rapid thermal annealing (RTA), rapid thermal cleaning (RTC), rapid thermal chemical vapor deposition (RTCVD), rapid thermal oxidation (RTO), and rapid thermal nitridation (RTN).

RTP seeks to minimize the negative effects of necessary thermal treatments, and thus reduce the thermal budget of a semiconductor wafer, by subjecting the semiconductor wafer to high temperatures (typically 420–1150° C.) only long enough to achieve the desired process effect. Systems are commercially available to perform RTP and generally utilize large-area incoherent energy sources such as radiant heat lamps operating in the wavelengths of 0.5 to 3 μm. RTP systems typically thermally isolate the semiconductor wafer being processed such that radiant heating is the dominant mode of transfer, seeking to minimize heat transfer by conduction at the wafer surface or convection around the wafer surface.

RTP was started as a research technique some 25 years ago using pulsed laser beams. As the semiconductor industry continues its trend into submicron devices, RTP is becoming a core technology step in the development and mass production of ultra-large system integration (ULSI) devices. Since their introduction more than a decade ago, RTP processors employing incoherent lamps are now the mainstay.

Despite these prior improvements to thermal processing, difficulties still exist. To achieve desired semiconductor device characteristics, temperatures and dopant implant depths must be adjusted within small process windows to achieve the desired process effect while compensating for the inevitable diffusion. As device sizes are reduced, control of implant diffusion becomes more critical. Reducing thermal effect to the semiconductor substrate relaxes and widens the available process window for control of implant diffusion.

Furthermore, in many semiconductor fabrication steps requiring heat input, the desired process effect relates only to the surface of the semiconductor wafer. In these cases, there is no need or desire to provide heat input to the substrate. It should be noted that all references to the substrate within this disclosure shall include all layers underlying the surface.

One such use of RTP is for a process known as contact reflow following anisotropic etching. Etching in semiconductor fabrication involves the removal of material from the wafer surface. Anisotropic etching is typically used to describe etching occurring only in the direction perpendicular to the wafer surface. This vertical etching results in sharp edges on contact holes, making them difficult to fill. Where flowable glass, such as borophosphosilicate glass (BPSG), is used for isolation, passivation or surface planarization, these sharp edges may be rounded through the process of contact reflow.

Contact reflow involves the heating or annealing of the glass to cause reflow and, therefore, rounding of surface features. With rounded surface features, coverage of contact holes by subsequent metal film layers is improved. Because the process seeks only to round the surface features of the glass surface layer, heat input to the underlying layers is neither required nor desired.

In light of the foregoing, it may be desirable to selectively increase the processing temperature of the surface layer of a semiconductor wafer while reducing the thermal effects to the substrate that would normally occur in pre-existing rapid thermal processing.

SUMMARY OF THE INVENTION

The invention allows the user to increase the thermal effect delivered to the surface layer of a semiconductor wafer in relation to the thermal effect delivered to the substrate. The desired effect is produced by introducing radiation-absorptive gas into the heating chamber of a radiant heating system. Thermal energy absorbed by the radiation-absorptive gas in contact with the semiconductor wafer increases heat transfer to the wafer surface through conduction while reducing radiant heat transfer available to the substrate. Radiation-absorptive gas may be combined with a gas that absorbs only minimal or negligible radiant energy to thus modify or regulate the level of absorptivity of the atmosphere within the heating chamber.

By increasing conductive heat transfer to the surface while reducing radiant heat transfer to the substrate, the surface will receive more heat input relative to the substrate. The result is that the surface temperature can be selectively increased in relation to the substrate, and the thermal budget of the wafer is reduced. Consequently, semiconductor devices produced according to the invention will have reduced thermal budgets.

Using the system and technique of the invention, semiconductor fabrication steps may be accomplished with reduced thermal effects to the semiconductor wafer substrate. At a minimum, a system suitable to practice the invention need only a radiant energy source, or radiation source, and an atmosphere that absorbs some radiant energy given off by the radiation source. The atmosphere must occupy the path of radiation which is emitted from the radiation source and directed to the surface of the object being heated.

In one embodiment of the invention, the atmosphere contains a single radiation-absorptive gas.

In another embodiment of the invention, the atmosphere contains a mixture of radiation-absorptive gases.

In a further embodiment of the invention, the atmosphere contains a mixture of a radiation-absorptive gas and a transparent gas.

In a still further embodiment of the invention, the atmosphere contains a mixture of a radiation-absorptive gas and two or more transparent gases.

In yet another embodiment of the invention, the atmosphere contains a mixture of two or more radiation-absorptive gases and a transparent gas.

In a further embodiment of the invention, the atmosphere contains a mixture of two or more radiation-absorptive gases and two or more transparent gases.

BRIEF DESCRIPTION OF THE DRAWINGS

In the drawings, where like numerals refer to like components throughout the several views.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and compositional changes may be made without departing from the spirit and scope of the invention. The following detailed description is, therefore, not to be taken in a limiting sense, and the scope of the invention is defined by the appended claims.

In general, a typical RTP system contains three major parts (see FIG. 1A): (a) a high-power lamp system or radiation source 22 heating the wafer 10; (b) a chamber 18 in which the wafer 10 and an atmosphere (not depicted) are contained; and (c) a pyrometer 20 to measure the wafer temperature. The lamp system can be either a set of tungsten-halogen lamps or a high-power arc lamp with a reflector. The wafer 10 has a backside 14 and a surface 15. The chamber 18 is generally a quartz chamber. In all cases, the lamps are separated from the wafer with a quartz window 24.

Figure 1A:
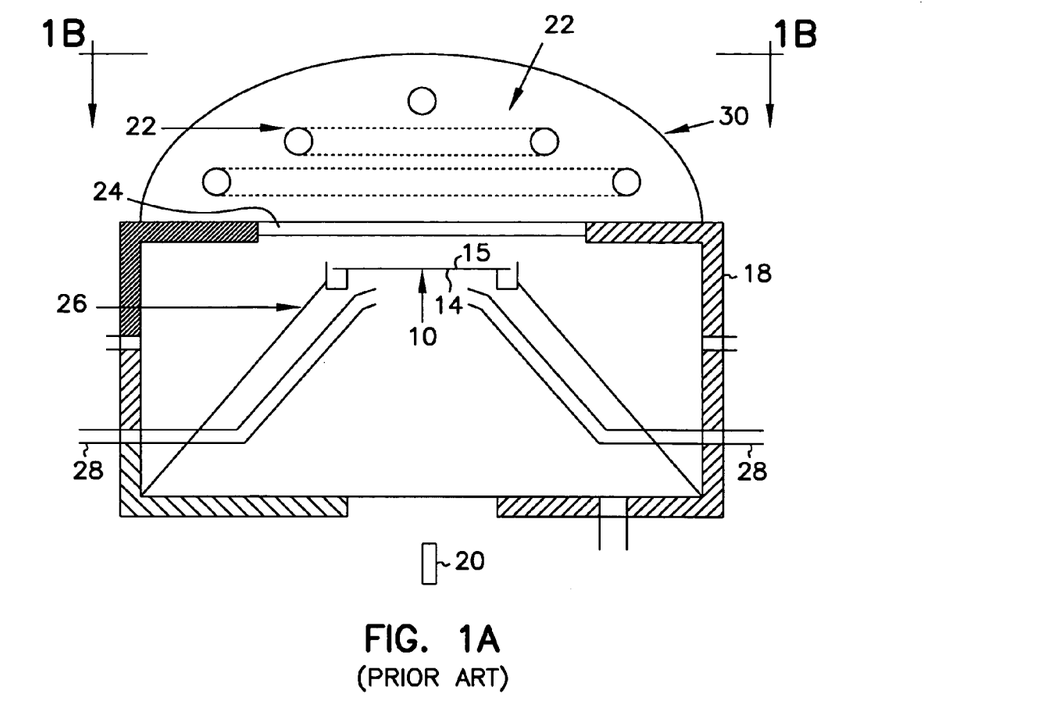
FIG. 1A is a cross-section view of one type of a pre-existing rapid thermal processing (RTP) system.

The pyrometer 20 measures the radiation that is emitted from the backside 14 of the wafer and converts this into substrate, or wafer, temperature. Other non-invasive temperature measurement techniques based on thermal expansion of the wafer, laser interferometry, and acoustic interference are being developed to accurately measure the temperature. The temperature measurement technique chosen, or whether temperature is measured at all, in no way limits the invention. As an alternative to or in addition to pyrometer 20, other sensors may be implemented to measure temperature, reflectance, or other mechanical properties such as stress elasticity.

Other features of this typical RTP system include the quartz wafer holder 26, the process gas conduits 28, and the reflector 30. The wafer 10 is placed or positioned on wafer holder 26 such that radiation from the radiation source 22 is directed at and impinges on the surface 15 of wafer 10. Process gas conduits 28 act as an inlet for gas flow in the chamber 18. Depending on the gas flow rate through process gas conduits 28, it is possible to have both free and forced convection within the RTP atmosphere. Reflector 30 assists directing radiation from radiation source 22 to the surface 15 of wafer 10. A complete RTP system would contain additional components, such as robotic handling elements and staging elevators, but these are not of concern to the invention disclosed and claimed.

In typical RTP processing, the wafer 10 would absorb radiation primarily through surface 15 in chamber 18 from radiation source 22. While radiation from radiation source 22 is not limited to a direction perpendicular to the surface 15 of wafer 10, such direction is a reasonable approximation of the transfer of radiant energy to wafer 10. Time and temperature within chamber 18 would be directed by the desired process effect.

Figure 1B:
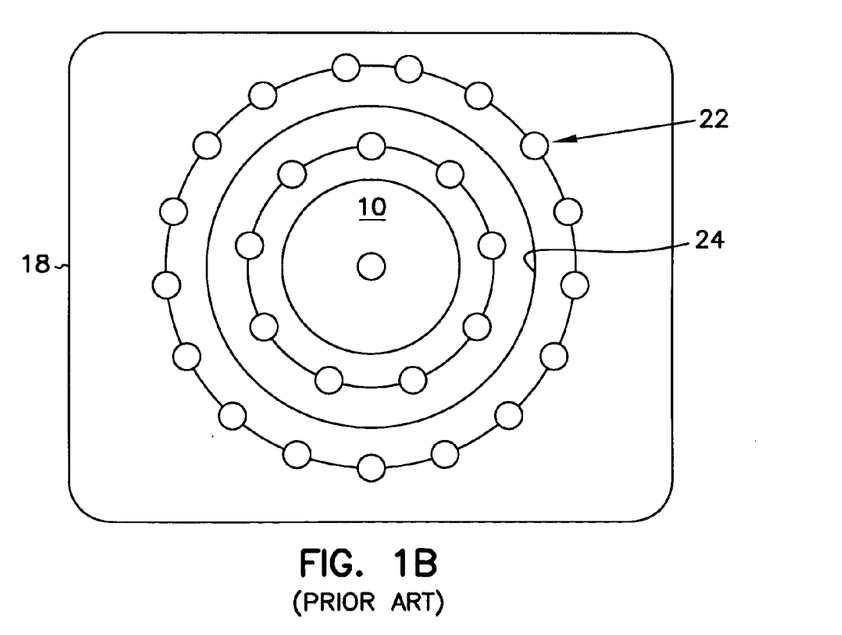
FIG. 1B is a plan view of the RTP system taken through line 1B-1B of FIG. 1A.

The heating lamp system comes in four basic geometries: the line source, the square source, the hexagonal source, and the ring source. FIG. 1B is an example of the ring source lamp system, where the lamp bank consists of an outer ring, middle ring, and an inner lamp or ring of lamps.

RTP is generally carried out with chamber 18 containing an inert atmosphere of Ar, $N_2$ or a vacuum. Oxygen and $NH_3$, however, have previously been introduced into the processing chamber of an RTP system when the desired process effect is to induce the growth of $SiO_2$ and $Si_3N_4$, respectively. The RTP atmospheres are generally transparent to the radiation source, thus allowing the radiant energy to transfer to the wafer 10 with only negligible absorption by the atmosphere surrounding the wafer 10.

The system and process of the invention work equally well at any pressure, from pressures above atmospheric to those below atmospheric. In fact, increases or reductions in pressure can be used to selectively raise or lower desired absorptivity of the radiation-absorptive atmosphere. An increase in pressure will increase the molecular density of the gaseous atmosphere, thus allowing more absorptive gas per unit volume and increasing the absorptivity. Likewise, a reduction in pressure will decrease the molecular density of the gaseous atmosphere, thus reducing the absorptive gas per unit volume and decreasing the absorptivity.

Figure 2:
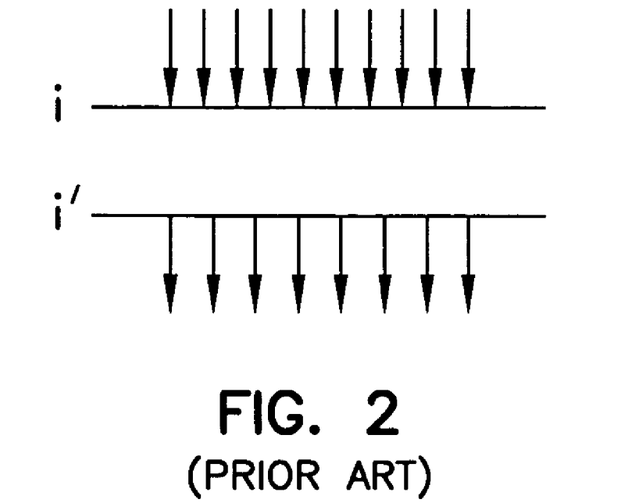
FIG. 2 is a pictorial representation of the relative radiation loss through a transparent atmosphere.
Figure 3:
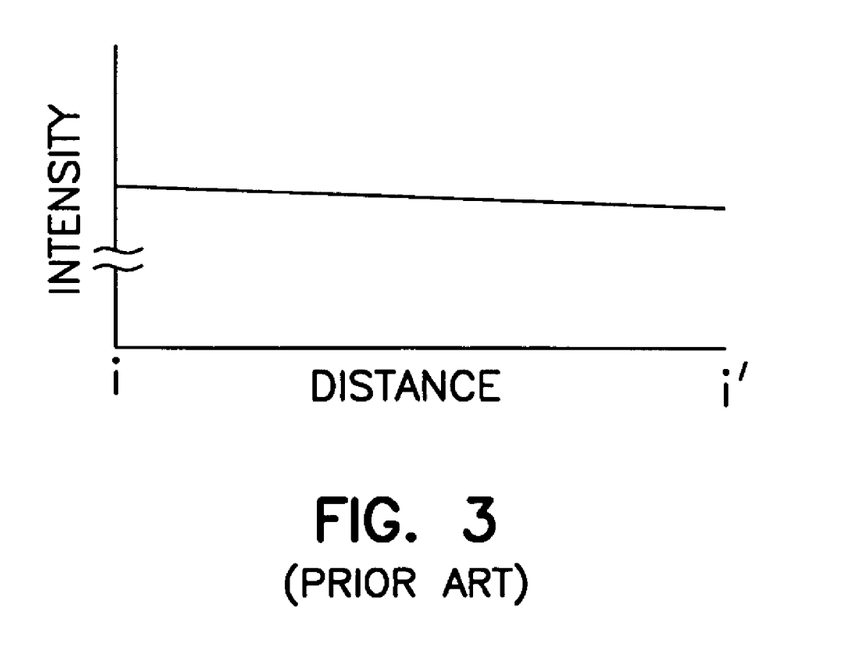
FIG. 3 is a graphical representation of the relative radiation loss through a transparent atmosphere.

As stated previously, the gas or atmosphere within chamber 18 of pre-existing RTP systems is generally inert and transparent to the radiant energy of radiation source 22. In other words, the intensity of the radiant energy leaving radiation source 22 is virtually identical to the intensity of the radiant energy arriving at the surface 15 of wafer 10. FIGS. 2 and 3 are a pictorial and graphical representation of the change in intensity of the radiant energy emitted by radiation source 22 as it travels from radiation source 22, point I, to surface 15, point I', in chamber 18 of pre-existing RTP systems. FIGS. 2 and 3 are intended to show that there is negligible reduction in intensity of radiant energy through the transparent atmosphere. There is no scale as these figures are offered for conceptual representation only.

In one embodiment of the invention, a radiation-absorptive gas replaces the transparent atmosphere in chamber 18. The radiation-absorptive gas is chosen such that it has an increased index of absorption, in the wavelength(s) of the radiant energy from radiation source 22, over the transparent atmosphere generally utilized in an RTP system.

The radiation-absorptive gas must absorb radiation in at least one of the wavelengths of the radiation source, and all references to radiation-absorptive gases will presume that they absorb radiation in one or more of the relevant wavelengths emitted by the provided radiation source. The relevant wavelengths of a radiation source are the dominant wavelengths providing for heat transfer to the process object. Conversely, a gas is transparent if it does not absorb radiant energy of the relevant wavelengths of the radiation source. Note that due to the wide range of wavelengths that may be given off by a radiation source due to factors such as type, degradation or contamination, and that are not a prominent source of heat transfer to the object, a transparent gas may absorb wavelengths that are not relevant wavelengths.

Figure 4:
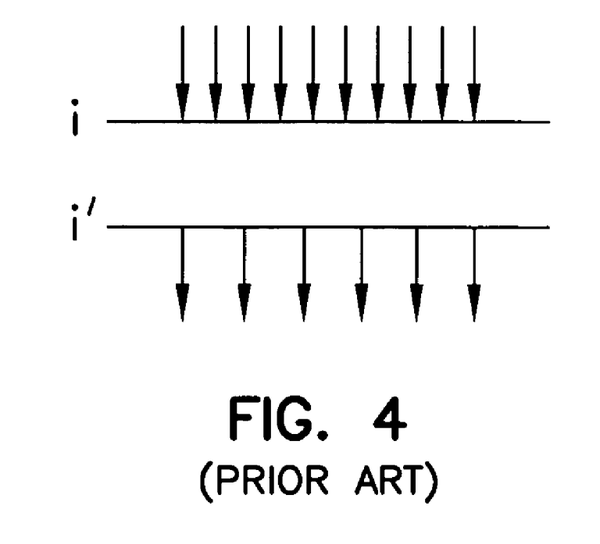
FIG. 4 is a pictorial representation of the relative radiation loss through a radiation-absorptive atmosphere.
Figure 5:
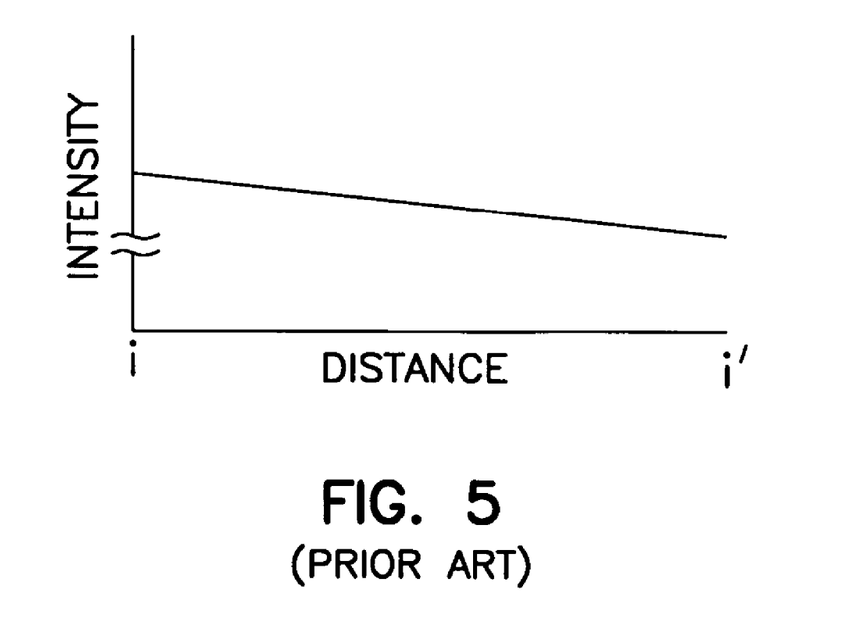
FIG. 5 is a graphical representation of the relative radiation loss through a radiation-absorptive atmosphere.

The result of surrounding surface 15 with a radiation-absorptive atmosphere is that the intensity of the radiant energy emitted by radiation source 22 is more significantly reduced as it travels from radiation source 22 to surface 15. FIGS. 4 and 5 are a pictorial and graphical representation of the change in intensity of the radiant energy emitted by radiation source 22 as it travels from radiation source 22, point I, to surface 15, point I', utilizing a radiation-absorptive gas in the atmosphere of chamber 18. By utilizing the invention, there is now a non-negligible reduction in intensity of the radiant energy as it travels through the absorptive atmosphere. There is no scale as these figures are offered for conceptual representation only.

By providing an atmosphere with a higher propensity to absorb radiation in one or more wavelengths of the spectrum radiated by radiation source 22, two phenomena occur: 1) temperature increases within chamber 18; and 2) radiant energy impinging on surface 15 is reduced.

The temperature within chamber 18 increases as energy is absorbed by the absorptive atmosphere. The absorbed energy raises the internal energy of the absorptive atmosphere, thus increasing its temperature. There will be some increase in convective heat transfer within the atmosphere of chamber 18 as the temperature change induces convection. More importantly, however, with the temperature surrounding surface 15 increased, heat transfer by conduction of the absorbed energy from the atmosphere within chamber 18 to surface 15 is increased. It is recognized that heat transfer by conduction from surface 15 to the substrate of wafer 10 would also increase to some degree.

The energy absorbed by the absorptive atmosphere within chamber 18 also results in decreased levels of radiation available to impinge on surface 15. This results in a decreased level of radiant heat transfer to surface 15 and wafer 10. It is believed that the decreased level of heat transfer by radiation to wafer 10 will generally exceed the increased level of conductive heat transfer to the substrate of wafer 10. Combined, the energy transfer to surface 15 exceeds the energy transfer to the substrate of wafer 10, thus supporting the observed phenomena that equivalent process effects can be achieved at reduced substrate temperatures.

In an alternative embodiment of the invention, the atmosphere of chamber 18 contains a mixture of more than one absorptive gas. Choosing absorptive gases that absorb radiation of different wavelengths can increase the total energy absorbed over that of each individual gas. In addition, mixtures of gases can interact through bonding or reaction to generate additional absorption wavelengths. Furthermore, some individual gases will have strong absorptivity while others will be weak absorbers. Accordingly, the concentration of individual gases is guided by the desired level of absorption of one or more wavelengths of radiant energy and is, therefore, without practical limit. Simply put, the user is free to choose any number or combination of absorptive gases. The user can vary the individual concentrations, guided by the physical characteristics of the individual gases, to achieve the desired level of absorption and, therefore, the desired process effect.

In a further embodiment of the invention, one or more absorptive gases may be combined with one or more transparent gases. As with all other embodiments, concentration of any individual gas is not limited. Two phenomena may occur through the addition of transparent gases. Transparent gas may act to reduce the overall level of absorbed radiation by displacing absorptive gases. Additionally, transparent gas may aid removal of absorbed energy from an absorptive gas, thereby increasing the overall level of absorbed radiation by increasing the number of unexcited absorptive molecules. Regardless of whether one or both phenomena occur, the user is provided with an additional tool to achieve the desired level of absorption and, therefore, the desired process effect.

For radiation sources operating in the wavelengths of 0.5 to 3 μm, the following gases have been identified for semiconductor processing incorporating the invention: $H_2O$, Ar, $H_2$, $CO_2$, $NH_3$, $N_2$, $NO_2$, $N_2O_3$, $N_2O_4$, $N_2O_5$, NO, $N_2O$, He, $O_3$, Kr, Ne, Xe, Rn and $Cl_2$. Of these gases, $H_2O$, $CO_2$, NH$_3$ and N$_2$O are of particular interest due to their absorptive properties in the relevant wavelengths. Furthermore, N$_2$ and Ar are of particular interest due to their transparency in the relevant wavelengths.

Although NH$_3$ has previously been used as a reactant species, the invention utilizes NH$_3$ for purposes other than where nitridation is the desired process effect. An example would be glass reflow applications where nitridation inhibits glass reflow. Accordingly, use of NH$_3$ as an absorptive gas should occur at process conditions which do not promote nitridation. It is believed that nitridation will not occur at temperatures below about 700° C.

Determination of whether a gas is absorptive or transparent at a specific wavelength does not require undue experimentation. Individual gases or mixtures of gas may be subjected to the science of spectroscopy to determine the absorption of light at various wavelengths. Spectrophotometers are commercially available to measure transmission or absorption of wavelengths from the infrared (IR) and near infrared (NIR) spectra through the ultraviolet (UV) spectrum.

In an exemplary embodiment of the invention, the atmosphere of an RTP system contains an absorptive mixture of Ar, H$_2$ and H$_2$O at approximate molar concentrations of 10–80%, 10–40% and 10–50%, respectively. The RTP system utilizes a radiation source operating in the relevant wavelengths of 0.5 to 3 μm. A semiconductor wafer of embedded DRAMs (Dynamic Random Access Memory) is introduced into the absorptive atmosphere under the heating element to affect reflow of BPSG on the wafer surface without adversely affecting implant diffusion or the integrity of Ti-salicide, a self-aligned silicide. To achieve equivalent process results of a pre-existing RTP system operating at 800° C., the system of the exemplary embodiment may operate at the reduced temperature of 750° C.

Figure 6:
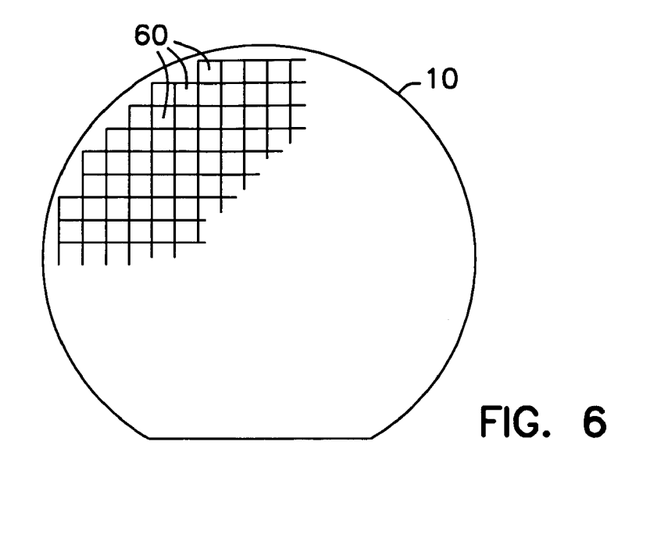
FIG. 6 is an elevation view of a semiconductor wafer containing semiconductor dies according to one embodiment of the invention.

With reference to FIG. 6, in one embodiment, a die 60 is produced from the wafer 10 processed according to the invention. A die is an individual rectangular pattern on a semiconductor wafer that contains circuitry to perform a specific function. A semiconductor wafer will typically contain a repeated pattern of such dies containing the same functionality. Die 60 may contain circuitry for a simple DRAM, as discussed above, or it may extend to such complex circuitry as a monolithic processor with multiple functionality. Die 60 is typically packaged in a protective casing (not shown) with leads extending therefrom (not shown) providing access to the circuitry of the die for unilateral or bilateral communication and control.

Figure 7:
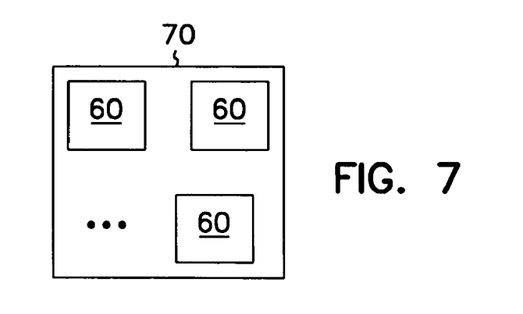
FIG. 7 is a block diagram of a circuit module incorporating semiconductor dies according to one embodiment of the invention.

As shown in FIG. 7, two or more dies 60 may be combined, with or without protective casing, into a circuit module 70 to enhance or extend the functionality of an individual die 60. Circuit module 70 may be a combination of dies 60 representing a variety of functions, or a combination of dies 60 containing the same functionality. Some examples of a circuit module include memory modules, power modules, communication modules, processor modules and application-specific modules and may include multilayer, multichip modules. Circuit module 70 may be a subcomponent of a variety of electronic systems, such as a clock, a radio, a dishwasher, a television, a cell phone, a personal computer, an automobile, an automated teller machine, an industrial control system, an aircraft and others. Circuit module 70 will have a variety of leads extending therefrom (not shown) providing unilateral or bilateral communication and control.

Figure 8:
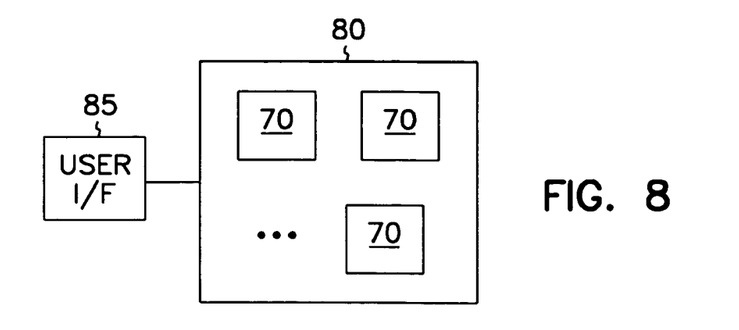
FIG. 8 is a block diagram of an electronic system incorporating circuit modules according to one embodiment of the invention.

FIG. 8 shows one such electronic system 80 containing one or more circuit modules 70. Electronic system 80 generally contains a user interface 85. User interface 85 provides a user of the electronic system 80 with some form of control or observation of the results of the electronic system 80. Some examples of user interface 85 include the keyboard, pointing device, CRT and printer of a personal computer; the tuning dial, display and speakers of a radio; the ignition switch and gas pedal of an automobile; and the card reader, keypad, display and currency dispenser of an automated teller machine. As will be apparent from the lists of examples previously given, electronic system 80 will often contain certain mechanical components (not shown) in addition to circuit modules 70 and user interface 85.

To reiterate, an absorptive gas mixture may contain any combination of one or more absorptive gases. The absorptive gas mixture may be void of transparent gases or it may contain one or more transparent gases. Individual gases may exist in the absorptive gas mixture at any concentration. Concentration and choice of gases is guided by the desired process effect or level of absorption, and the relevant wavelengths of the radiation source. Of course, the summation of all individual concentrations must equal 100%.

Furthermore, in all embodiments of the invention, the realities of industrial processing must be recognized. Where a reference is made to purity of the gaseous atmosphere, the reader must remember that there will always be some incident contamination, either at the percentage, ppm, ppb or atomic level. This contamination will come from multiple sources, such as that inherently found in the gases from their source or re-use, or in their preparation; that coming from outgassing or evaporation of the object being processed or the environment of the processing chamber; and that introduced through leaks or other openings in the processing chamber. Acceptable levels of contamination will be dependent on the nature and needs of the process, the processing equipment and environment utilized, and the source and nature of the materials used. Thus, composition of the gaseous atmosphere describes the relevant composition and disregards incident contamination.

Use of the invention provides semiconductor wafer and device fabrication at reduced thermal budgets. Such semiconductor devices having reduced thermal budgets will have improved performance characteristics due to reduced dopant diffusion Although specific embodiments have been illustrated and described herein, it will be appreciated by those of ordinary skill in the art that any arrangement which is calculated to achieve the same purpose may be substituted for the specific embodiments shown. For example, the present invention is not so limited to the exemplary embodiment. Furthermore, more than one object may be processed simultaneously without departing from the scope herein. Additionally, those skilled in the art will recognize that processing may occur batchwise or in a continuous process. Therefore, this application is intended to cover any adaptations or variations of the present invention and it is manifestly intended that this invention be limited only by the claims and the equivalents thereof.

What is claimed is:

1. A system comprising:
   a heating chamber and a semiconductor wafer placed in the chamber;
   a radiation source for emitting radiation at least one wavelength in the range of 0.5 μm to 3.0 μm at the semiconductor wafer, the semiconductor wafer including a surface and a glass layer on the surface; and
   a radiation-absorptive atmosphere placed within the chamber, the radiation-absorptive atmosphere including H₂O to regulate the level of absorptivity of the atmosphere within the heating chamber through a combination of radiation heat transfer from the radiation source and conductive heat transfer from the radiation-absorptive atmosphere to increase a thermal effect delivered to the surface of the semiconductor wafer in relation to a thermal effect delivered to a bulk of the semiconductor wafer to affect reflow of the glass layer in the heating chamber.

2. The system of claim 1, wherein the radiation-absorptive atmosphere is placed in a path between the radiation source and the semiconductor wafer.

3. The system of claim 1, wherein the radiation source includes a radiation of at least one wavelength.

4. The system of claim 1, wherein the radiation-absorptive atmosphere includes at least one radiation-absorptive gas.

5. The system of claim 1, wherein the radiation-absorptive atmosphere includes at least one radiation-absorptive gas and at least one transparent gas.

6. The system of claim 1, wherein the radiation-absorptive atmosphere includes at least one gas selected from the group consisting of Ar and N₂.

7. The system of claim 1, wherein a pressure of the radiation-absorptive atmosphere within the chamber is below atmospheric.

8. The system of claim 1, wherein a pressure of the radiation-absorptive atmosphere within the chamber is at or above atmospheric.

9. A system comprising:
a heating chamber and a semiconductor wafer placed in the chamber, the semiconductor wafer including a surface and a glass layer on the surface;
a radiation source for emitting radiation at the semiconductor wafer; and
a radiation-absorptive atmosphere placed within the chamber, the radiation-absorptive atmosphere comprises substantially 10–80 mol % Ar, substantially 10–40 mol % H₂, and substantially 10–50 mol % H₂O to regulate the level of absorptivity of the atmosphere within the heating chamber through a combination of radiation heat transfer from the radiation source and conductive heat transfer from the radiation-absorptive atmosphere to increase a thermal effect delivered to the surface of the semiconductor wafer in relation to a thermal effect delivered to a bulk of the semiconductor wafer to affect reflow of the glass layer in the heating chamber.

10. The system of claim 9, wherein the radiation-absorptive atmosphere is placed in a path between the radiation source and the semiconductor wafer.

11. The system of claim 9, wherein the radiation source includes a radiation of at least one wavelength.

12. The system of claim 9, wherein a pressure of the radiation-absorptive atmosphere within the chamber is at least equal to atmospheric.

13. The system of claim 9, wherein a pressure of the radiation-absorptive atmosphere within the chamber is below atmospheric.

14. A system comprising:
a heating chamber and a semiconductor wafer placed in the chamber, the semiconductor wafer including a surface and a glass layer on the surface;
a radiation source for emitting radiation of at least one wavelength in the range of 0.5 µm to 3.0 µm at the semiconductor wafer; and
a radiation-absorptive atmosphere placed within the chamber, the radiation-absorptive atmosphere including CO₂ to regulate level of absorptivity of the atmosphere within the heating chamber through a combination of radiation heat transfer from the radiation source and conductive heat transfer from the radiation-absorptive atmosphere to increase a thermal effect delivered to the surface of the semiconductor wafer in relation to a thermal effect delivered to a bulk of the semiconductor wafer to affect reflow of the glass layer in the heating chamber.

15. The system of claim 14, wherein the radiation-absorptive atmosphere is placed in a path between the radiation source and the semiconductor wafer.

16. The system of claim 14, wherein a pressure of the radiation-absorptive atmosphere within the chamber is at least equal to atmospheric.

17. The system of claim 14, wherein a pressure of the radiation-absorptive absorptive atmosphere within the chamber is below atmospheric.

18. A system comprising:
a heating chamber and a semiconductor wafer placed in the chamber, the semiconductor wafer including a surface and a glass layer on the surface;
a radiation source for emitting radiation at the semiconductor wafer; and
a radiation-absorptive atmosphere placed within the chamber, the radiation-absorptive atmosphere including a mixture of gases, wherein the radiation-absorptive atmosphere comprises substantially 10–80 mol % Ar, substantially 10–40 mol % H₂, and substantially 10–50 mol % H₂O, and wherein the mixture of gases is selected to regulate the level of absorptivity of the atmosphere within the heating chamber through a combination of radiation heat transfer from the radiation source and conductive heat transfer from the radiation-absorptive atmosphere to increase a thermal effect delivered to the surface of the semiconductor wafer in relation to a thermal effect delivered to a bulk of the semiconductor wafer to affect reflow of the glass layer in the heating chamber of 750° C.

19. The system of claim 18, wherein the radiation-absorptive atmosphere is placed in a path between the radiation source and the semiconductor wafer.

20. The system of claim 18, wherein the radiation source includes a radiation of at least one wavelength.

21. The system of claim 18, wherein a pressure of the radiation-absorptive atmosphere within the chamber is at least equal to atmospheric.

22. The system of claim 18, wherein a pressure of the radiation-absorptive atmosphere within the chamber is below atmospheric.

23. A system comprising:
a heating chamber and a semiconductor wafer placed in the chamber, the semiconductor wafer including a surface and a glass layer on the surface;
a radiation source for emitting radiation of at least one wavelength in the range of 0.5 µm to 3.0 µm at the semiconductor wafer; and
a radiation-absorptive atmosphere placed within the chamber, the radiation-absorptive atmosphere including a mixture of gases, wherein the radiation-absorptive atmosphere comprises substantially 10–80 mol % Ar, substantially 10–40 mol % H₂, and substantially 10–50 mol % H₂O, and wherein the mixture of gases is selected to regulate the level of absorptivity of the atmosphere within the heating chamber through a combination of radiation heat transfer from the radiation source and conductive heat transfer from the radiation-absorptive atmosphere to increase a thermal effect delivered to the surface of the semiconductor wafer in relation to a thermal effect delivered to a bulk of the semiconductor wafer to affect reflow of the glass layer in the heating chamber.

24. The system of claim 23, wherein the radiation-absorptive atmosphere is placed in a path between the radiation source and the semiconductor wafer.

25. The system of claim 23, wherein a pressure of the radiation-absorptive atmosphere within the chamber is at least equal to atmospheric.

26. The system of claim 23, wherein a pressure of the radiation-absorptive atmosphere within the chamber is below atmospheric.

* * * * *

UNITED STATES PATENT AND TRADEMARK OFFICE
CERTIFICATE OF CORRECTION

PATENT NO. : 7,247,584 B2  Page 1 of 1
APPLICATION NO. : 10/931592
DATED : July 24, 2007
INVENTOR(S) : Powell

It is certified that error appears in the above-identified patent and that said Letters Patent is hereby corrected as shown below:

In column 10, line 1, in Claim 14, after "regulate" insert -- the --.

In column 10, line 17, in Claim 17, after "radiation-absorptive" delete "absorptive".

Signed and Sealed this

Twenty-fourth Day of June, 2008

JON W. DUDAS
*Director of the United States Patent and Trademark Office*